United States Patent
Chang et al.

(10) Patent No.: US 8,803,019 B2
(45) Date of Patent: Aug. 12, 2014

(54) ELECTRODE ARRAY OF TOUCH PANEL

(75) Inventors: Chih-chao Chang, Taipei (TW); Chao-yong Hsu, Changhua (TW); Shih-hung Huang, Zhongli (TW); Hung-hsiang Chen, Zhongli (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 189 days.

(21) Appl. No.: 13/557,225

(22) Filed: Jul. 25, 2012

(65) Prior Publication Data

US 2013/0313098 A1 Nov. 28, 2013

(30) Foreign Application Priority Data

May 25, 2012 (TW) .............................. 101118800 A

(51) Int. Cl.
*H03K 17/975* (2006.01)
(52) U.S. Cl.
USPC .......................................... 200/600; 345/173
(58) Field of Classification Search
USPC ........................................................ 200/600
See application file for complete search history.

(56) References Cited

U.S. PATENT DOCUMENTS

| | | | |
|---|---|---|---|
| 2013/0180841 A1* | 7/2013 | Yilmaz et al. | 200/600 |
| 2013/0270095 A1* | 10/2013 | Yau et al. | 200/600 |
| 2013/0277193 A1* | 10/2013 | Son | 200/600 |

* cited by examiner

*Primary Examiner* — Renee Luebke
*Assistant Examiner* — Lheiren Mae Caroc
(74) *Attorney, Agent, or Firm* — Mark M. Friedman

(57) ABSTRACT

Disclosure is an electrode array of a touch panel, which includes a plurality of rhombus-shaped electrodes, dumbbell-shaped electrodes, and bridge wires. The rhombus-shaped electrodes are arranged along a first direction and interconnected in the first direction. The dumbbell-shaped electrodes are arranged along a second direction. Each dumbbell-shaped electrode has a first enlarged part, a second enlarged part, and a narrow part. Here, each rhombus-shaped electrode is disposed between two adjacent dumbbell-shaped electrodes along the second direction. The bridge wires are used for electrically coupling the two first enlarged parts and the two second enlarged parts of the two adjacent dumbbell-shaped electrodes, respectively. The production reliability of the present invention is increased according to the dumbbell-shaped electrodes.

9 Claims, 4 Drawing Sheets

ELECTRODE ARRAY OF TOUCH PANEL

TECHNICAL FIELD OF THE INVENTION

The present invention relates to a touch panel, and especially to an electrode array of a touch panel.

BACKGROUND OF THE INVENTION

In recent years, applications of consumer electronics having capacitive touch panels are already a mainstream market design. Enhancement of sensing characteristic is one of important development goals at the current stage. Currently, there is an urgent need to improve an electrostatic discharge (ESD) problem. When a user operates a product with a capacitive touch panel, a function of the touch panel is damaged because of the existence of ESD. This problem has become the focus and concern for improvement for the manufacturers.

Electrostatic charges are usually generated by rubbing or other reasons while using the capacitive touch panel or manufacture processes thereof. Greater electrostatic charges can easily lead to the ESD effect to release electrical energy. In a releasing process, the touch panel may be struck and burnt at various situations and places where charges can easily accumulate such as thin, tip, and bending places.

Referring to FIG. 1, FIG. 1 shows a conventional electrode array of a touch panel. The conventional electrode array 100 includes rhombus-shaped electrodes 120 arranged along a horizontal direction and rhombus-shaped electrodes 140 arranged along a vertical direction. The rhombus-shaped electrodes 140 that are arranged along the vertical direction are connected in series via bridge wires 150. The excessive charges are easily accumulated at both ends 151 and 152 of the bridge wire 150 in external or internal electrical operations of the capacitive touch panel, causing the bridge wire 150 to be burnt out at the both ends 151 and 152. An entire column of the rhombus-shaped electrodes where the burnt-out place is located fails to work; thus product reliability and sensing accuracy are reduced.

SUMMARY OF THE INVENTION

Accordingly, an objective of the present invention is to provide an electrode array of a touch panel by a design of dumbbell-shaped electrodes to solves the above-mentioned problem that the bridge wires are easily broken.

To achieve the foregoing objective, an electrode array of a touch panel provided in the present invention includes a plurality of rhombus-shaped electrodes, a plurality of dumbbell-shaped electrodes, and a plurality of bridge wires. The rhombus-shaped electrodes are arranged along a first direction, and the rhombus-shaped electrodes are interconnected in the first direction. The dumbbell-shaped electrodes are arranged along a second direction. Each of the dumbbell-shaped electrodes has a first enlarged part, a second enlarged part, and a narrow part connecting between the first enlarged part and the second enlarged part. Each of the rhombus-shaped electrodes is disposed between two adjacent ones of the dumbbell-shaped electrodes along the second direction. The bridge wires are used for electrically coupling the two first enlarged parts of the two adjacent dumbbell-shaped electrodes and electrically coupling the two second enlarged parts of the two adjacent dumbbell-shaped electrodes, respectively.

In one preferred embodiment, each bridge wire staggers a connection between two of the rhombus-shaped electrodes and is insulated from the connection between the two rhombus-shaped electrodes.

In one preferred embodiment, a shape of each of the first enlarged part and the second enlarged part is an isosceles triangle. In addition, a shape of the narrow part is a strip, and the strip is coupled between two vertices of the isosceles triangles.

In one preferred embodiment, the first direction is perpendicular to the second direction.

In one preferred embodiment, the first direction is a sensing direction of the touch panel, and the second direction is a driving direction of the touch panel. Accordingly, a sensing line is formed by the rhombus-shaped electrodes arranged along the first direction, and a driving line is formed by the dumbbell-shaped electrodes arranged along the second direction.

In another preferred embodiment, the first direction is a driving direction of the touch panel, and the second direction is a sensing direction of the touch panel. Accordingly, a driving line is formed by the rhombus-shaped electrodes arranged along the first direction, and a sensing line is formed by the dumbbell-shaped electrodes arranged along the second direction.

In one preferred embodiment, the electrode array of the present invention further includes a plurality of point discharge components. The point discharge components are disposed on edges of the rhombus-shaped electrodes and edges of the first enlarged parts and the second enlarged parts of the dumbbell-shaped electrodes.

In accordance with the design of the dumbbell-shaped electrodes, if a bridge wire which couples the first enlarged parts therebetween is broken, an electrical signal thereof can conduct via another bridge wire which couples the second enlarged parts therebetween, thereby product reliability can be increased. In this manner, the present invention overcomes the shortcoming of lines become disconnected after conventional bridge wires are broken. Moreover, in accordance with the design of the dumbbell-shaped electrodes, the accuracy of touch positions can be improved.

It is to be understood that both the foregoing general description and the following detailed description of the present invention are exemplary and explanatory and are intended to provide further explanation of the invention as claimed.

DETAILED DESCRIPTION OF THE INVENTION

Figure 1:
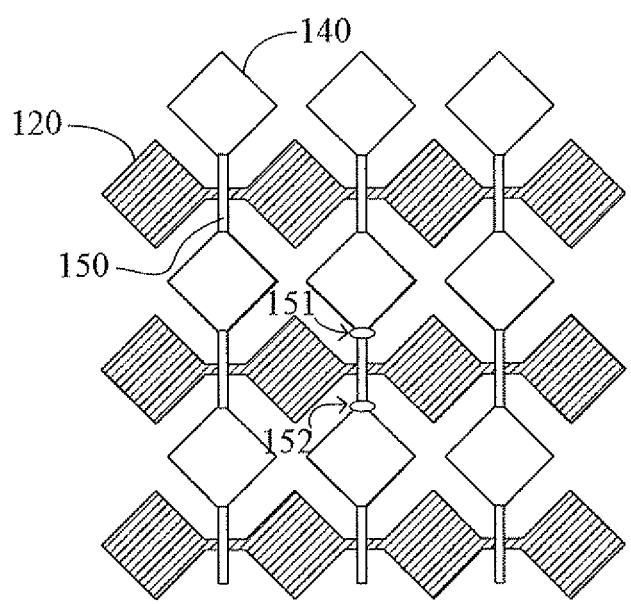
FIG. 1 is a conventional electrode array of a touch panel.
Figure 2:
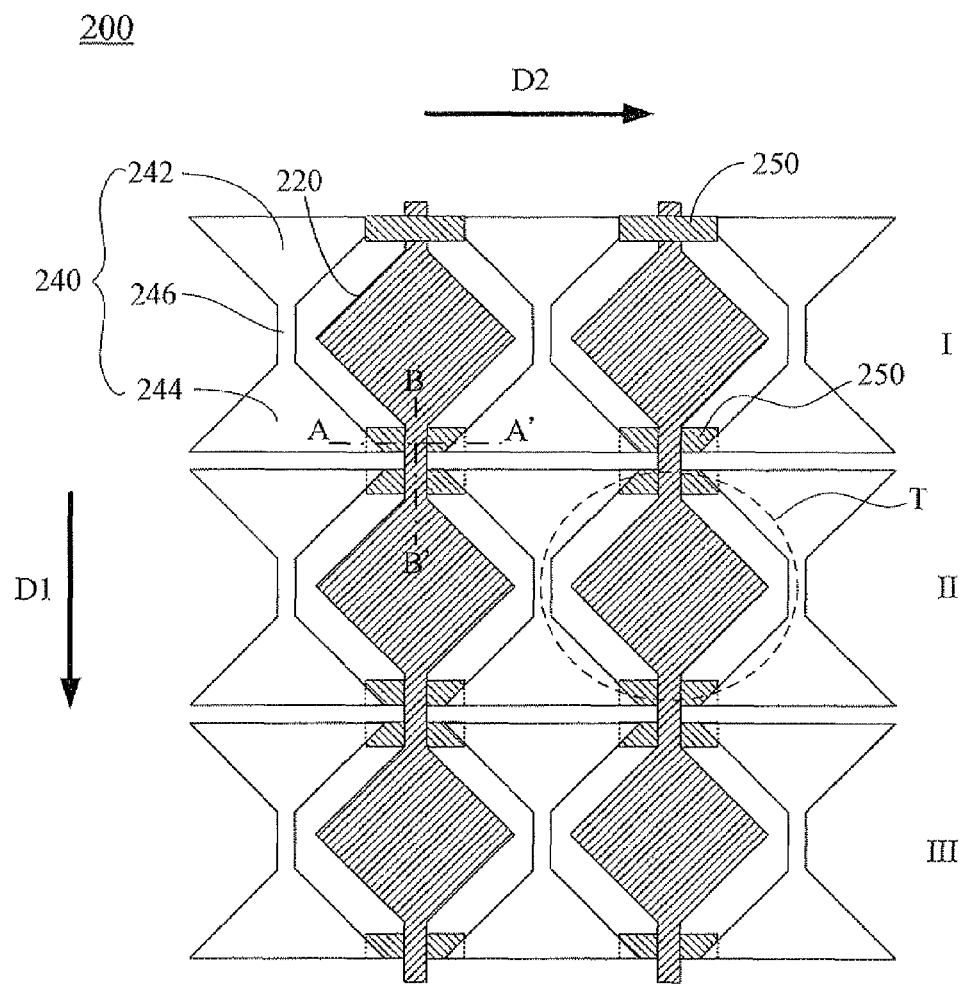
FIG. 2 is a top view schematically illustrating an electrode array of a touch panel according to a first preferred embodiment of the present invention.

The present invention will now be described in detail with reference to a preferred embodiment, thereof as illustrated in the accompanying drawings. In different drawings the same reference numbers will be used throughout the drawings to refer to the same or like parts. Referring to FIG. 2, FIG. 2 is a top view schematically illustrating an electrode array of a touch panel according to a first preferred embodiment of the present invention, in which the electrode array according to the preferred embodiment is generally designated at 200. The electrode array 200 includes a plurality of rhombus-shaped electrodes 220, a plurality of dumbbell-shaped electrodes 240, and a plurality of bridge wires 250.

As shown in FIG. 2, the rhombus-shaped electrodes 220 are arranged along a first direction D1 into a plurality of columns, and the rhombus-shaped electrode 220 of each column is interconnected in the first direction D1. In the preferred embodiment, the first direction D1 is a vertical direction. The dumbbell-shaped electrodes 240 are arranged along a second direction D2 into a plurality of rows. In the preferred embodiment, the second direction D2 is a horizontal direction. Each of the dumbbell-shaped electrodes 240 has a first enlarged part 242, a second enlarged part 244, and a narrow part 246 is connected between the first enlarged part 242 and the second enlarged part 244. In this embodiment, the connecting direction of the narrow part 246 is perpendicular to the second direction D2, i.e. parallel to the first direction D1. That is, the dumbbell-shaped electrodes 240 in the same row are arranged in the manner that the first enlarged part 242 of each of the dumbbell-shaped electrodes 240 is adjacent to the first enlarged part 242 of an adjacent dumbbell-shaped electrode 240 along the second direction D2. Also, the second enlarged part 244 of each of the dumbbell-shaped electrodes 240 is adjacent to the second enlarged part 244 of the adjacent dumbbell-shaped electrode 240 along the second direction D2. Furthermore, the first enlarged part 242 and the second enlarged part 244 of each of the dumbbell-shaped electrodes 240 are interconnected via the narrow part 246. As shown in the drawing, each of the rhombus-shaped electrodes 240 is disposed 240 between the two adjacent dumbbell-shaped electrodes 240 along the second direction D2.

In the preferred embodiment, a shape of each of the first enlarged part 242 and the second enlarged part 244 is an isosceles triangle. In addition, a shape of the narrow part 346 is a strip, and the strip is coupled between two vertices of the isosceles triangles. However, specific shapes of the first enlarged part 242, the second enlarged part 244, and the narrow part 246 are not limited in the present invention.

Figure 3:
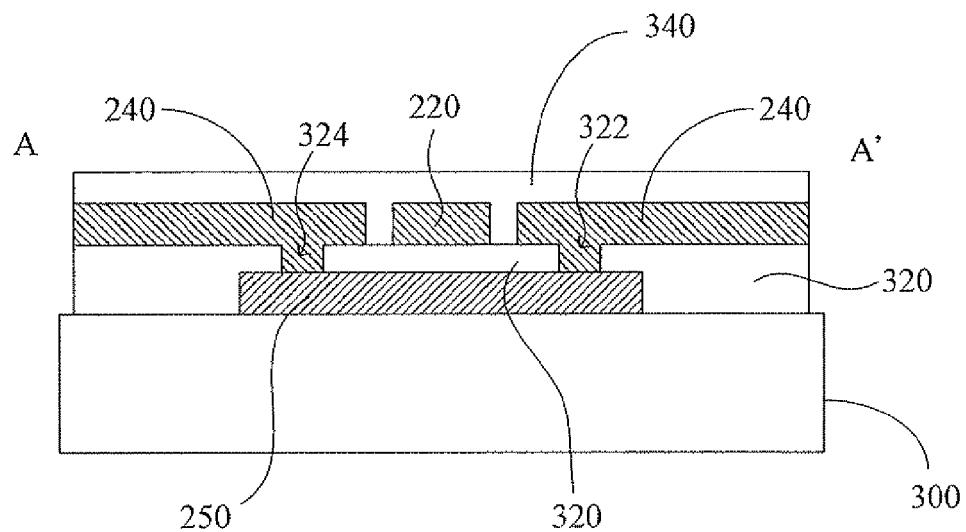
FIG. 3 is a schematic cross-sectional view along A-A' in FIG. 2.
Figure 4:
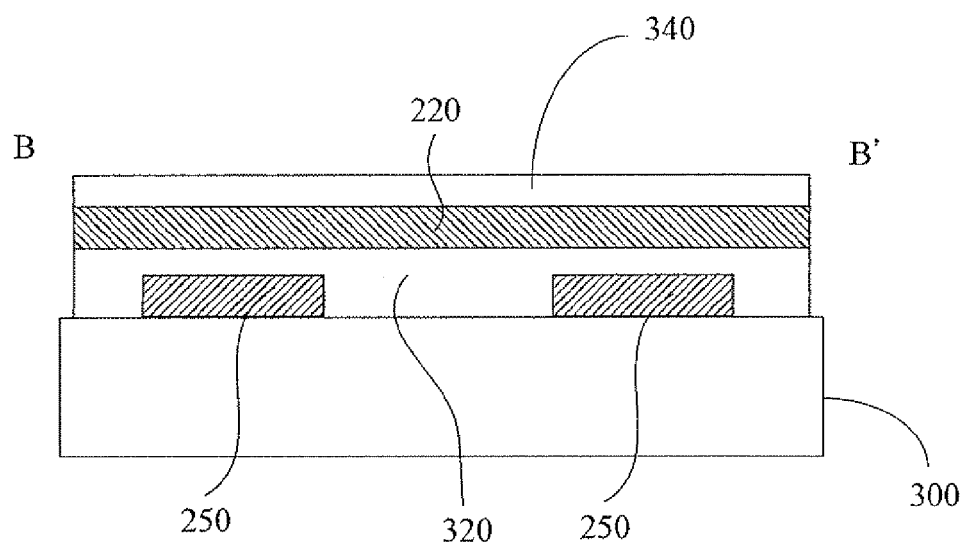
FIG. 4 is a schematic cross-sectional view along B-B' in FIG. 2.

Referring to FIGS. 2-4, FIG. 3 is a schematic cross-sectional view along A-A' in FIG. 2, and FIG. 4 is a schematic cross-sectional view along B-B' in FIG. 2. The bridge wires 250 are used for electrically coupling the two first enlarged parts 242 of the two adjacent dumbbell-shaped electrodes 240 and electrically coupling the two second enlarged parts 244 of the two adjacent dumbbell-shaped electrodes 240 in the same row along the second direction D2, respectively. Specifically, the bridge wires 250 are disposed on the substrate 300, and the material thereof is metal preferably. As shown in FIG. 3, each bridge wire 250 staggers the connection between two of the rhombus-shaped electrodes 220 and is insulated from the connection between the two rhombus-shaped electrodes 220. Specifically, there is an insulation layer 320 covering the bridge wires 250, and contact holes 322 and 324 are defined on the insulation layer 320 at suitable positions (e.g. two base angles) of the first enlarged part 242 and the second enlarged part 244 of the dumbbell-shaped electrode 240. Subsequently, the rhombus-shaped electrodes 220 and the dumbbell-shaped electrodes 240 which are made of transparent conductive material are covered on the insulation layer 320, and the material is indium tin oxide (ITO), or indium zinc oxide (IZO), preferably. The first enlarged parts 242 and the second enlarged part 244 of the two adjacent dumbbell-shaped electrodes 240 are electrically coupled to the bridge wires 250 via the contact holes 322 and 324. Finally, there is a protective layer 340 covering the rhombus-shaped electrodes 220 and the dumbbell-shaped electrodes 240.

Referring to FIG. 2 again, in the embodiment, the first direction D1 (vertical direction) is perpendicular to the second direction D2 (horizontal direction). However, the first direction D1 and the second direction D2 are not limited to be perpendicular to each other in the present invention. Also other angles can be defined between both directions. In the embodiment, the first direction D1 is a sensing direction of the touch panel, and the second direction D2 is a driving direction of the touch panel. Accordingly, a sensing line is formed by the rhombus-shaped electrodes 220 arranged along the first direction D1, and a driving line is formed by the dumbbell-shaped electrodes 240 arranged along the second direction D2.

Referring to FIG. 2 again, when a user touches the touch panel of the embodiment to form a touch point T, the rhombus-shaped electrodes 220 on the touch point T has a mutual capacitance action only between the dumbbell-shaped electrodes 240 which are adjacent left and right sides of the rhombus-shaped electrodes 220. Then the touch panel can accurately obtained the position of the touch point T within a driving line II rather than within a driving line I or a driving line III. The electrode array can reach a better accuracy in comparison with the electrode array implemented by the prior art.

In another preferred embodiment, the first direction D1 is a driving direction of the touch panel, and the second direction D2 is a sensing direction of the touch panel. Accordingly, a driving line is formed by the rhombus-shaped electrodes 220 arranged along the first direction D1, and a sensing line is formed by the dumbbell-shaped electrodes 240 arranged along the second direction D2.

Figure 5:
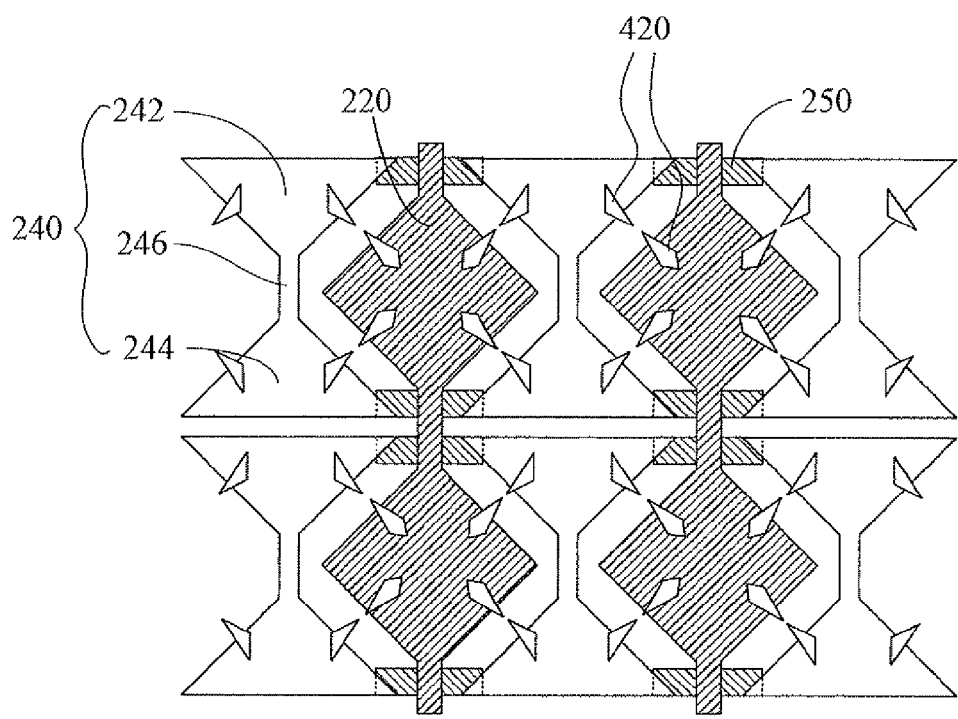
FIG. 5 is an electrode array of a touch panel according to a second preferred embodiment of the present invention.

Referring to FIG. 5, FIG. 5 is an electrode array of a touch panel according to a second preferred embodiment of the present invention. In addition to the above-mentioned rhombus-shaped electrodes 220, dumbbell-shaped electrodes 240, and the bridge wires 250, the electrode array 400 further includes a plurality of point discharge components 420 according to the second preferred embodiment. The point discharge components 420 are disposed on edges of the rhombus-shaped electrodes 220 and edges of the first enlarged parts 242 and the second enlarged parts 244 of the dumbbell-shaped electrodes 240, Accordingly, the rhombus-shaped electrodes 220 have many more paths for the electrostatic discharge via the point discharge components 420, thereby reducing the charges within the electrode being accumulated at the single bridge wires 250. Furthermore, inactivity and incorrect identification result from the damage of the touch panel can be avoided to improve the product durability.

As mentioned above, according to the design of the dumbbell-shaped electrodes 240, if the bridge wires 250 coupled between the first enlarged parts 242 is broken, the electrical signal thereof can be conducted via the bridge wires 250 coupled between the second enlarged parts 244, thereby increasing the product reliability. Accordingly, the present invention overcomes the shortcoming that the line becomes disconnected after the conventional bridge wire is broken. In addition, the accuracy of touch positioning can be improved according to the design of the dumbbell-shaped electrodes 240.

While the preferred embodiments of the present invention have been illustrated and described in detail, various modifications and alterations can be made by persons skilled in this art. The embodiment of the present invention is therefore described in an illustrative but not restrictive sense.

What is claimed is:

1. An electrode array of a touch panel, comprising:
a plurality of rhombus-shaped electrodes arranged along a first direction and interconnected in the first direction;
a plurality of dumbbell-shaped electrodes arranged along a second direction, each of the dumbbell-shaped electrodes having a first enlarged part, a second enlarged part, and a narrow part connecting between the first enlarged part and the second enlarged part, each rhombus-shaped electrode being disposed between two adjacent ones of the dumbbell-shaped electrodes along the second direction;
a plurality of bridge wires for electrically coupling the two first enlarged parts of the two adjacent dumbbell-shaped electrodes and electrically coupling the two second enlarged parts of the two adjacent dumbbell-shaped electrodes, respectively; and
a plurality of point discharge components, the point discharge components being disposed on edges of the rhombus-shaped electrodes and edges of the first enlarged parts and the second enlarged parts of the dumbbell-shaped electrodes.

2. The electrode array of a touch panel of claim 1, wherein each bridge wire staggers a connection between two of the rhombus-shaped electrodes and is insulated from the connection between the two rhombus-shaped electrodes.

3. The electrode array of a touch panel of claim 1, wherein a shape of each of the first enlarged part and the second enlarged part is an isosceles triangle.

4. The electrode array of a touch panel of claim 3, wherein a shape of the narrow part is a strip, and the strip is coupled between two vertices of the isosceles triangles.

5. The electrode array of a touch panel of claim 1, wherein the first direction is perpendicular to the second direction.

6. The electrode array of a touch panel of claim 1, wherein the first direction is a sensing direction of the touch panel, and the second direction is a driving direction of the touch panel.

7. The electrode array of a touch panel of claim 6, wherein a sensing line is formed by the rhombus-shaped electrodes arranged along the first direction, and a driving line is formed by the dumbbell-shaped electrodes arranged along the second direction.

8. The electrode array of a touch panel of claim 1, wherein the first direction is a driving direction of the touch panel, and the second direction is a sensing direction of the touch panel.

9. The electrode array of a touch panel of claim 8, wherein a driving line is formed by the rhombus-shaped electrodes arranged along the first direction, and a sensing line is formed by the dumbbell-shaped electrodes arranged along the second direction.

* * * * *